(12) United States Patent
Nishiyama et al.

(10) Patent No.: US 7,788,565 B2
(45) Date of Patent: Aug. 31, 2010

(54) SEMICONDUCTOR INTEGRATED CIRCUIT

(75) Inventors: Takako Nishiyama, Gunma (JP); Hideo Ito, Gunma (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 200 days.

(21) Appl. No.: 12/246,873

(22) Filed: Oct. 7, 2008

(65) Prior Publication Data
US 2009/0106610 A1 Apr. 23, 2009

(30) Foreign Application Priority Data
Oct. 12, 2007 (JP) .............................. 2007-266860

(51) Int. Cl.
*G01R 31/28* (2006.01)
(52) U.S. Cl. ...................... 714/740; 714/724; 714/726
(58) Field of Classification Search ................. 714/740, 714/724, 726, 729, 30, 733, 734; 716/4
See application file for complete search history.

(56) References Cited

U.S. PATENT DOCUMENTS 5,109,383 A * 4/1992 Chujo ......................... 714/726
7,228,476 B2 * 6/2007 Scipioni et al. ............. 714/733

FOREIGN PATENT DOCUMENTS

JP 2001-59856 3/2001

* cited by examiner

*Primary Examiner*—Phung M Chung
(74) *Attorney, Agent, or Firm*—Morrison & Foerster LLP

(57) ABSTRACT

A semiconductor integrated circuit having a low maximum allowable operating frequency such as an analog circuit can be prevented from being destroyed during a scan test. When a scan test mode signal is "1", output signals of a first AND circuit and a second AND circuit are fixed to a low level and an output of an OR circuit is fixed to a high level. Therefore, output signals of fourth through sixth flip-flops FF4-FF6 are not transferred to first through third analog circuits during the scan test. On the other hand, the output signals of the fourth through sixth flip-flops FF4-FF6 are transferred to the first through third analog circuits during a normal operation.

16 Claims, 2 Drawing Sheets

SEMICONDUCTOR INTEGRATED CIRCUIT

CROSS-REFERENCE OF THE INVENTION

This application claims priority from Japanese Patent Application No. 2007-266860, the content of which is incorporated herein by reference in its entirety.

BACKGROUND OF THE INVENTION

1. Field of the Invention

This invention relates to a semiconductor integrated circuit having a scan test function that facilitates testing of the semiconductor integrated circuit.

2. Description of the Related Art

In general, a large scale integrated circuit (hereafter referred to as an LSI) undergoes a GO/NO-GO test by an LSI tester before shipping. It is necessary that a test pattern used in the GO/NO-GO test is designed to be capable of detecting failures in a plurality of logic circuits constituting the LSI as thoroughly as possible.

However, testing all the logic circuits requires an enormous amount of test vectors and test time as the scale of the LSI becomes large. In order to solve the problem, so-called Design for Testability has been put into practice.

The Design for Testability is a design technology that a test plan of an LSI is taken into consideration in a design stage of the LSI and test circuits are embedded in the LSI. Observability and controllability are basic concepts that indicate testability of the LSI. A circuit with good observability means that a logical value at a certain node in the circuit can be easily measured from outside, while a circuit with good controllability means that a logical value at a certain node in the circuit can be easily set by inputting data from outside. The better the observability and the controllability are, the more easily an effective test pattern can be created. As a result, a failure detection rate of the logic circuits constituting the LSI is improved. A scan test circuit is one of the test circuits that enhance the observability and the controllability.

The scan test circuit includes a plurality of flip-flops, each of which is disposed corresponding to each of logic circuits in the LSI. The plurality of flip-flops form a shift register when connected in a chain formation. The scan test circuit performs a shift operation that is sequentially shifting data taken into the flip-flops and capture operation that is capturing an output of each of the logic circuits into corresponding each of the flip-flops.

That is, data in each of the flip-flops is provided to each of the logic circuits as a test signal by a first shift operation. Next, output data of each of the logic circuits is taken into each of the flip-flops by the capture operation. Then, the output data of each of the logic circuits taken into each of the flip-flops is sequentially outputted from the flip-flop in the last stage by the shift operation that follows. A GO/NO-GO judgment on each of the logic circuits is made by comparing the output data of each of the logic circuits with its expected value. Technologies related to the scan test circuit are disclosed in Japanese Patent Application Publication No. 2001-59856, for example.

The scan test circuit described above is also embedded in a semiconductor integrated circuit that incorporates both digital circuits and analog circuits. In most cases, a maximum operating frequency of the shift register during the scan test is higher than a maximum allowable operating frequency of the analog circuits. Therefore, if a high frequency output signal of the flip-flop is transferred to the analog circuit during the scan test, there is a risk that the analog circuit is destroyed because the high frequency output signal of the flip-flop exceeds the maximum allowable operating frequency of the analog circuit.

SUMMARY OF THE INVENTION

The invention provides a semiconductor integrated circuit that includes a first circuit having a plurality of logic circuits and a plurality of flip-flops. Each of the flip-flops is provided for a corresponding logic circuit. The semiconductor integrated circuit also includes a plurality of selectors connecting the flip-flops to the first circuit in a normal operation. The selectors are configured to connect the flip-flops in a chain formation so that the flip-flops make a shift register during a scan test. The semiconductor integrated circuit further includes a second circuit having the maximum allowable operating frequency lower than the maximum operating frequency of the shift register during the scan test, and a gate circuit that receives an output of one of the flip-flops and controls a transfer of the output so that the output is transferred to the second circuit during the normal operation and the output is not transferred to the second circuit during the scan test.

DETAILED DESCRIPTION OF THE INVENTION

Figure 1:
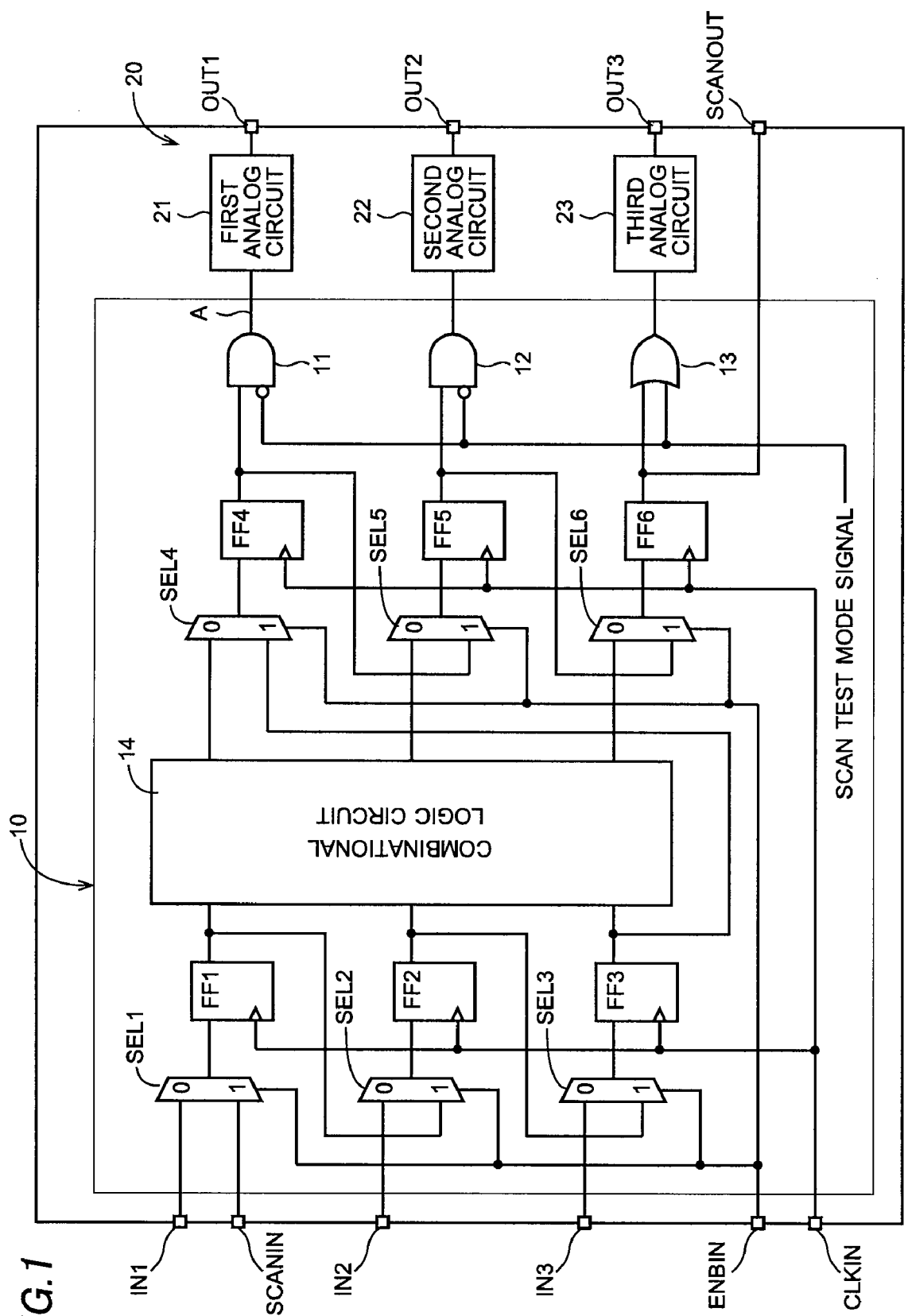
FIG. 1 shows a structure of a semiconductor integrated circuit according to an embodiment of this invention.

A semiconductor integrated circuit according to an embodiment of this invention is hereafter described referring to the drawings. FIG. 1 shows a structure of the semiconductor integrated circuit. A digital circuit 10 and an analog circuit 20 are provided on a common semiconductor die. The digital circuit 10 is provided with first through sixth flip-flops FF1-FF6 and first through sixth selectors SEL1-SEL6. Each of the flip-flops FF1-FF6 corresponds to each of the selectors SEL1-SEL6, respectively.

The first through sixth flip-flops FF1-FF6 are D-type flip-flops (delay flip-flop circuits). A clock terminal of each of the flip flops FF1-FF6 is provided with a clock CLK inputted through an input terminal CLKIN. With this, each of the flip-flops FF1-FF6 takes in data at a rise of the clock CLK and outputs the data that has been taken in at a subsequent rise of the clock CLK. A larger number of flip-flops are provided in an actual semiconductor integrated circuit. For example, there are 300 to 500 flip-flops in a semiconductor integrated circuit having 20,000 to 30,000 transistors.

Each of the selectors SEL1-SEL6 is provided with an input terminal 0 and an input terminal 1, one of which is selected according to a scan enable signal inputted through an scan enable signal input terminal ENBIN. In this example, the input terminal 1 is selected when the scan enable signal is "1", while the input terminal 0 is selected when the scan enable signal is "0".

A combinational logic circuit 14 is a target circuit of the scan test, and is composed of AND circuits, NAND circuits, inverter circuits and the like.

Connections among the flip-flops FF1-FF6, selectors SEL1-SEL6 and the combinational logic circuit 14 are described hereafter. A first input terminal IN1 is connected to the input terminal 0 of the first selector SEL1, and an input terminal SCANIN through which a scan test signal is inputted is connected to the input terminal 1 of the first selector SEL1. An output signal of the first selector SEL1 is inputted to the first flip-flop FF1. An output signal of the first flip-flop FF1 is applied to the combinational logic circuit 14 and the input terminal 1 of the second selector SEL2.

A second input terminal IN2 is connected to the input terminal 0 of the second selector SEL2 and an output signal of the second selector SEL2 is inputted to the second flip-flop FF2. An output signal of the second flip-flop FF2 is applied to the combinational logic circuit 14 and the input terminal 1 of the third selector SEL3.

A third input terminal IN3 is connected to the input terminal 0 of the third selector SEL3 and an output signal of the third selector SEL3 is inputted to the third flip-flop FF3. An output signal of the third flip-flop FF3 is applied to the combinational logic circuit 14 and the input terminal 1 of the fourth selector SEL4.

A first output signal of the combinational logic circuit 14 is applied to the input terminal 0 of the fourth selector SEL4, and an output signal of the fourth selector SEL4 is inputted to the fourth flip-flop FF4. An output signal of the fourth flip-flop FF4 is applied to the input terminal 1 of the fifth selector SEL5, as well as being inputted to a first AND circuit 11 (an example of a gate circuit recited in a claim of this invention).

A second output signal of the combinational logic circuit 14 is applied to the input terminal 0 of the fifth selector SEL5, and an output signal of the fifth selector SEL5 is inputted to the fifth flip-flop FF5. An output signal of the fifth flip-flop FF5 is applied to the input terminal 1 of the sixth selector SEL6, as well as being inputted to a second AND circuit 12 (an example of the gate circuit recited in the claim of this invention).

A third output signal of the combinational logic circuit 14 is applied to the input terminal 0 of the sixth selector SEL6, and an output signal of the sixth selector SEL6 is inputted to the sixth flip-flop FF6. An output signal of the sixth flip-flop FF6 is outputted through a scan signal output terminal SCANOUT, as well as being inputted to an OR circuit 13 (an example of the gate circuit recited in the claim of this invention).

A reverse signal of a scan test mode signal is inputted to the first AND circuit 11 and the second AND circuit 12, while the scan test mode signal is inputted to the OR circuit 13. The scan test mode signal indicates whether the scan test is active or inactive. In this example, the scan test is active, that is, the scan test is on the way when the scan test mode signal is "1", and the scan test is inactive, that is, the scan test is not on the way (the semiconductor integrated circuit is in the normal operation) when the scan test mode signal is "0".

An output signal of the first AND circuit 11 is inputted to a first analog circuit 21, an output signal of the second AND circuit 12 is inputted to a second analog circuit 22, and an output signal of the OR circuit 13 is inputted to a third analog circuit 23. An output signal of the first analog circuit 21 is outputted through a first output terminal OUT1, an output signal of the second analog circuit 22 is outputted through a second output terminal OUT2, and an output signal of the third analog circuit 23 is outputted through a third output terminal OUT3. In this embodiment, the maximum allowable operating frequency of the first through third analog circuits 21-23 is lower than the maximum operating frequency of the digital circuit 10 that includes the shift register formed of the first through sixth flip-flops FF1-FF6.

When the scan test mode signal is "1", the output signals of the first AND circuit 11 and the second AND circuit 12 are fixed to a low level and the output of the OR circuit 13 is fixed to a high level. Therefore, the output signals of the fourth through sixth flip-flops FF4-FF6 are not transferred to the first through third analog circuits 21-23 during the scan test. On the other hand, the output signals of the fourth through sixth flip-flops FF4-FF6 are transferred to the first through third analog circuits 21-23 during the normal operation.

Figure 2:
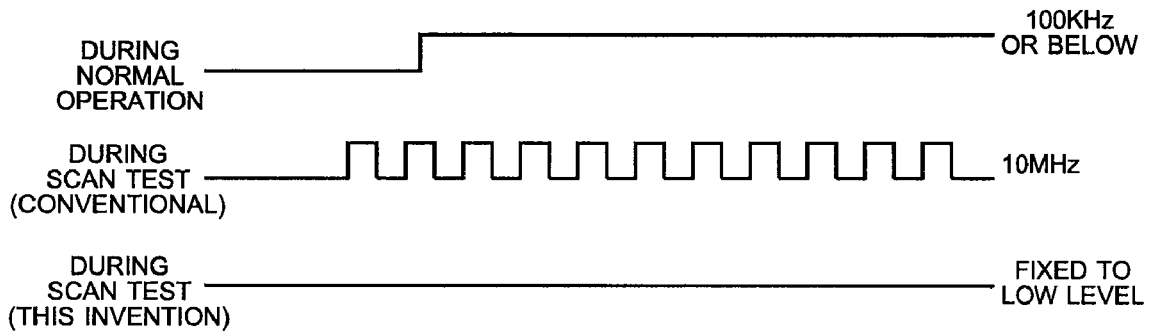
FIG. 2 is a waveform chart showing an operation of the semiconductor integrated circuit according to the embodiment of this invention.

Next, operations of the semiconductor integrated circuit described above are explained referring to FIG. 2. FIG. 2 shows the output signal (a signal appeared at a node A shown in FIG. 1) of the first AND circuit 11. It is assumed that the maximum operating frequency of the digital circuit 10 is 10 MHz or above and the maximum allowable operating frequency of the first through third analog circuits 21-23 is 100 KHz, for example.

The scan test mode signal is set to be "0" and the scan enable signal is set to be "0" during the normal operation. Since each of the first through sixth selectors SEL1-SEL6 selects the input terminal 0 consequently, the input signal inputted through the first input terminal IN1, for example, is taken into the first flip-flop FF1 through the first selector SEL1.

The output signal of the first flip-flop FF1 is inputted to the combinational logic circuit 14. A logical operation is performed in the combinational logic circuit 14 accordingly, and the first output signal, which is a result of the logical operation, is taken into the fourth flip-flop FF4 through the fourth selector SEL4. The output signal of the fourth flip-flop FF4 is inputted to the first analog circuit 21 through the first AND circuit 11. Similarly, the output signal of the fifth flip-flop FF5 is inputted to the second analog circuit 22 through the second AND circuit 12, and the output signal of the sixth flip-flop FF6 is inputted to the third analog circuit 23 through the OR circuit 13. At that time, the analog circuit 20 (the first through third analog circuits 21-23) operates normally, since the output signals of the first AND circuit 11, the second AND circuit 12 and the OR circuit 13 are controlled at the frequency of 100 KHz or below by the digital circuit 10.

Next, the scan test mode signal is set to be "1" and the scan enable signal is set to be "1" during the scan test. Since each of the first through sixth selectors SEL1-SEL6 selects the input terminal 1 consequently, the first through sixth flip-flops FF1-FF6 are connected in a chain formation to form a six-stage shift register. The scan test signal inputted through the input terminal SCANIN is transferred by the shift register in synchronization with the clock CLK, and finally outputted through the scan signal output terminal SCANOUT. The shift operation is carried out at a frequency as high as 10 MHz.

If the output signals of the fourth through sixth flip-flops FF4-FF6 are transferred to the first through third analog circuits 21-23, there is caused a risk of destruction of the first through third analog circuits 21-23 since the frequency of the output signals of the fourth through sixth flip-flops FF4-FF6 exceeds the maximum allowable operating frequency (maximum allowable input frequency) of the first through third analog circuits 21-23. According to the embodiment of this invention, the destruction of the first through third analog circuits 21-23 can be prevented because the output signals of the first AND circuit 11 and the second AND circuit 12 are fixed to the low level and the output signal of the OR circuit 13 is fixed to the high level during the scan test.

Next, when the scan enable signal is set to be "0", the first through sixth flip-flops FF1-FF6 return to separate flip-flops from the shift register, since the first through sixth selectors SEL1-SEL6 select the input terminals 0. Each of the fourth through sixth flip-flops FF4-FF6 takes in each of the first through third output signals of the combinational logic circuit 14, which are results of logical operations carried out based on the scan test signal (the capture operation).

When the scan enable signal is set to be "1" again, the first through sixth flip-flops FF1-FF6 form the shift register, and the data taken into the first through sixth flip-flops FF1-FF6 are transferred and finally outputted as time series data through the scan signal output terminal SCANOUT. During the shift operation, the destruction of the first through third analog circuits 21-23 can be prevented because the output signals of the first AND circuit 11 and the second AND circuit 12 are fixed to the low level and the output signal of the OR circuit 13 is fixed to the high level. A GO/NO-GO judgment on the combinational logic circuit is made by comparing the data outputted through the scan signal output terminal SCANOUT with its expected values.

Figure 3:
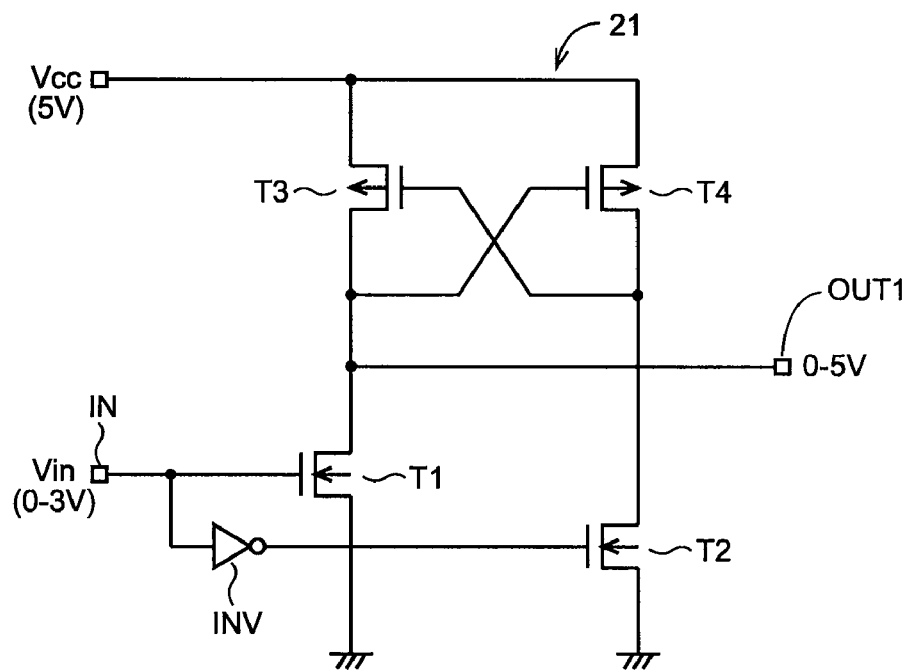
FIG. 3 shows a structure of a level shift circuit.

An example of each of the first through third analog circuits 21-23 is a level shift circuit that converts a level of an input signal. FIG. 3 shows a structure of the level shift circuit that constitutes each of the first through third analog circuits 21-23. An input voltage Vin is applied to a gate of an N-channel type MOS transistor with its source grounded, while a voltage generated by inverting the input voltage Vin by an inverter INV is applied to a gate of an N-channel type MOS transistor T2 with its source grounded. The input voltage Vin corresponds to a voltage of each of the output signals of the first AND circuit 11, the second AND circuit 12 and the OR circuit 13.

There are provided P-channel type MOS transistors T3 and T4 having gates and drains cross-connected to each other and sources to which a power supply voltage Vcc (5V) is applied. T3 is connected in series with T1, while T4 is connected in series with T2. An output terminal OUT1 is connected to the drain of T3. The level shift circuit can convert the input signal with its level ranging from 0 to 3 volts to a signal with its level ranging from 0 to 5 volts. Its maximum allowable operating frequency is about 100 KHz. When a changing rate of the input voltage Vin exceeds the maximum allowable operating frequency of the level shift circuit, a through current flows from the power supply voltage Vcc to the ground through the transistors T3 and T1 or through the transistors T4 and T2, putting the transistors at the risk of destruction.

Needless to say, this invention is not limited to the embodiment described above and may be modified within the scope of the invention. For example, although the first through third analog circuits 21-23 are used in this embodiment as having the maximum allowable operating frequency lower than the maximum operating frequency of the shift register, any other analog circuits or digital circuits may be used as long as they have a relatively low maximum allowable operating frequency. Even in the case of the digital circuit, there is the risk of destruction.

Also, although the first AND circuit 11, the second AND circuit 12 and the OR circuit 13 operate as gate circuits in this embodiment, other circuits may be used in their places as long as they do not allow transfer of the output signals of the flip-flop to the analog circuit during the scan test.

Since the output signal of the flip-flop is not transferred to the circuit having a lower maximum allowable operating frequency (the analog circuit, for example) during the scan test in the semiconductor integrated circuit according to the embodiment of this invention, the circuit is prevented from being destroyed.

What is claimed is:

1. A semiconductor integrated circuit comprising:
   a first circuit comprising a plurality of logic circuits;
   a plurality of flip-flops each provided for a corresponding logic circuit;
   a plurality of selectors connecting the flip-flops to the first circuit in a normal operation, the selectors being configured to connect the flip-flops in a chain formation so that the flip-flops make a shift register during a scan test;
   a second circuit having a maximum allowable operating frequency lower than a maximum operating frequency of the shift register during the scan test; and
   a gate circuit that receives an output of one of the flip-flops and controls a transfer of the output so that the output is transferred to the second circuit during the normal operation and the output is not transferred to the second circuit during the scan test.

2. The semiconductor integrated circuit of claim 1, wherein an output of the gate circuit is fixed to a predetermined level during the scan test.

3. The semiconductor integrated circuit of claim 2, wherein the first circuit comprises a digital circuit, and the second circuit comprises an analog circuit.

4. The semiconductor integrated circuit of claim 3, wherein the second circuit comprises a level shift circuit.

5. The semiconductor integrated circuit of claim 4, wherein the first circuit comprises a combinational logic circuit.

6. The semiconductor integrated circuit of claim 3, wherein the first circuit comprises a combinational logic circuit.

7. The semiconductor integrated circuit of claim 2, wherein the second circuit comprises a level shift circuit.

8. The semiconductor integrated circuit of claim 7, wherein the first circuit comprises a combinational logic circuit.

9. The semiconductor integrated circuit of claim 2, wherein the first circuit comprises a combinational logic circuit.

10. The semiconductor integrated circuit of claim 1, wherein the first circuit comprises a digital circuit, and the second circuit comprises an analog circuit.

11. The semiconductor integrated circuit of claim 10, wherein the second circuit comprises a level shift circuit.

12. The semiconductor integrated circuit of claim 11, wherein the first circuit comprises a combinational logic circuit.

13. The semiconductor integrated circuit of claim 10, wherein the first circuit comprises a combinational logic circuit.

14. The semiconductor integrated circuit of claim 1, wherein the second circuit comprises a level shift circuit.

15. The semiconductor integrated circuit of claim 14, wherein the first circuit comprises a combinational logic circuit.

16. The semiconductor integrated circuit of claim 1, wherein the first circuit comprises a combinational logic circuit.

* * * * *